(12) United States Patent
Chen

(10) Patent No.: US 7,521,364 B2
(45) Date of Patent: Apr. 21, 2009

(54) SURFACE TOPOLOGY IMPROVEMENT METHOD FOR PLUG SURFACE AREAS

(75) Inventor: Shih Hung Chen, Elmsford, NY (US)

(73) Assignee: Macronix Internation Co., Ltd., Hsinchu (TW)

( * ) Notice: Subject to any disclaimer, the term of this patent is extended or adjusted under 35 U.S.C. 154(b) by 227 days.

(21) Appl. No.: 11/380,988

(22) Filed: May 1, 2006

(65) Prior Publication Data
US 2007/0128870 A1 Jun. 7, 2007

Related U.S. Application Data

(60) Provisional application No. 60/741,828, filed on Dec. 2, 2005.

(51) Int. Cl.
*H01L 21/302* (2006.01)

(52) U.S. Cl. .................. 438/692; 438/700

(58) Field of Classification Search ......... 438/689–694, 438/700–704
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,515,488 A | 5/1996 | Stephens, Jr. |
| 5,534,712 A | 7/1996 | Ovshinsky et al. |
| 5,550,396 A | 8/1996 | Tsutsumi et al. |
| 5,687,112 A | 11/1997 | Ovshinsky |

(Continued)

FOREIGN PATENT DOCUMENTS

WO 9712393 4/1997

(Continued)

OTHER PUBLICATIONS

Adler, David, "Amorphous-Semiconductor Devices," Sci. Amer., vol. 236, pp. 36-48, May 1977.

(Continued)

*Primary Examiner*—Kin-Chan Chen
(74) *Attorney, Agent, or Firm*—James F. Hann; Haynes Beffel & Wolfeld LLP

(57) ABSTRACT

The surface topology of a plug surface area-containing surface of a semiconductor device can be improved by removing material to create a first planarized surface with at least one plug surface area, typically a tungsten or copper plug area, comprising a recessed region. A material is deposited onto the first planarized surface, to create a material layer, and into the upper portion of the recessed region. The material layer is removed to create a second planarized surface with the material maintained in the upper portion of the recessed region. To form a semiconductor phase change memory device, a phase change element is formed between the at least one plug area, acting as a first electrode, at the second planarized surface and a second electrode.

14 Claims, 4 Drawing Sheets

U.S. PATENT DOCUMENTS

| | | |
|---|---|---|
| 5,789,277 A | 8/1998 | Zahorik et al. |
| 5,789,758 A | 8/1998 | Reinberg |
| 5,807,786 A | 9/1998 | Chang et al. |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,304 B2 | 5/2005 | Moore |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,126,149 B2 | 10/2006 | Iwasaki et al. |
| 7,132,675 B2 | 11/2006 | Gilton |
| 7,164,147 B2 | 1/2007 | Lee et al. |
| 7,166,533 B2 | 1/2007 | Happ |
| 7,214,958 B2 | 5/2007 | Happ |
| 7,220,983 B2 | 5/2007 | Lung |
| 2002/0070457 A1* | 6/2002 | Sun et al. ..................... 257/774 |
| 2002/0072223 A1* | 6/2002 | Gilbert et al. ................ 438/629 |
| 2002/0113273 A1* | 8/2002 | Hwang et al. ................ 257/374 |
| 2003/0224598 A1 | 12/2003 | Lee et al. |
| 2004/0051094 A1 | 3/2004 | Ooishi |
| 2004/0178172 A1* | 9/2004 | Huang et al. ................... 216/20 |
| 2004/0248339 A1 | 12/2004 | Lung |
| 2005/0029502 A1 | 2/2005 | Hudgens |
| 2005/0062087 A1* | 3/2005 | Chen et al. ................... 257/295 |
| 2005/0093022 A1 | 5/2005 | Lung |
| 2005/0106919 A1* | 5/2005 | Layadi et al. ................ 439/290 |
| 2005/0130414 A1 | 6/2005 | Choi et al. |
| 2005/0167656 A1 | 8/2005 | Sun et al. |
| 2005/0201182 A1 | 9/2005 | Osada et al. |
| 2005/0212024 A1 | 9/2005 | Happ |
| 2005/0215009 A1 | 9/2005 | Cho |
| 2005/0285096 A1 | 12/2005 | Kozicki |
| 2006/0091476 A1 | 5/2006 | Pinnow et al. |
| 2006/0108667 A1 | 5/2006 | Lung |
| 2006/0110878 A1 | 5/2006 | Lung et al. |
| 2006/0118913 A1 | 6/2006 | Yi et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0281216 A1* | 12/2006 | Chang et al. ................. 438/102 |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0010054 A1 | 1/2007 | Fan et al. |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |

| | | | |
|---|---|---|---|
| 2007/0108431 A1 | 5/2007 | Chen et al. | |
| 2007/0109836 A1* | 5/2007 | Lung | 365/148 |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0131980 A1 | 6/2007 | Lung | |
| 2007/0138458 A1 | 6/2007 | Lung | |
| 2007/0147105 A1 | 6/2007 | Lung et al. | |
| 2007/0154847 A1 | 7/2007 | Chen et al. | |
| 2007/0155172 A1 | 7/2007 | Lai et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0173019 A1 | 7/2007 | Ho et al. | |
| 2007/0173063 A1 | 7/2007 | Lung | |
| 2007/0176261 A1 | 8/2007 | Lung | |
| 2007/0187664 A1* | 8/2007 | Happ | 257/4 |
| 2007/0235811 A1 | 10/2007 | Furukawa et al. | |
| 2007/0257300 A1 | 11/2007 | Ho et al. | |
| 2007/0298535 A1 | 12/2007 | Lung | |
| 2008/0014676 A1 | 1/2008 | Lung et al. | |

FOREIGN PATENT DOCUMENTS

| | | | |
|---|---|---|---|
| WO | WO 00/45108 A1 | 8/2000 | |
| WO | WO 00/79539 A1 | 12/2000 | |
| WO | WO 01/45108 A1 | 6/2001 | |

OTHER PUBLICATIONS

Adler, D. et al., "Threshold Switching in Chalcogenide-Glass Thin Films," J. Appl/ Phys 51(6), Jun. 1980, pp. 3289-3309.
Ahn, S.J. et al., "A Highly Manufacturable High Density Phase Change Memory of 64 Mb and Beyond," IEEE IEDM 2004, pp. 907-910.
Axon Technologies Corporation paper: Technology Description, pp. 1-6.
Bedeschi, F. et al., "4-MB MOSFET-Selected Phase-Change Memory Experimental Chip," IEEE, 2004, 4 pp.
Blake thesis, "Investigation of GeTeSb5 Chalcogenide Films for Use as an Analog Memory," AFIT/GE/ENG/00M-04, Mar. 2000, 121 pages.
Chen, An et al., "Non-Volatile Resistive Switching for Advanced Memory Applications," IEEE IEDM , Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al. "An Edge Contact Type Cell fro Phase Change RAM Featuring Very Low Power Consumption," 2003 Symposium on VLSI Technology Digest of Technical Papers, pp. 175-176.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.
Horii, H. et al. "A Novel Cell Technology Using N-doped GeSbTe Films for Phase Change RAM," 2003 Symposium on VLSI Technology Digest of Technical Papers, pp. 177-178.
Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L.; "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., OUM-A 180 nm Nonvolatile Memory Cell Element Technology for Stand Alone and Embedded Applications, IEEE IEDM 2001, pp. 803-806.
Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.
Prakash, S. et al., "A Guideline for Designing Chalcogenide-Based Glasses for Threshold Switching Characteristics," IEEE Electron Device Letters, vol. 18, No. 2, Feb. 1997, pp. 45-47.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.
Wicker, Guy et al., Nonvolatile, High Density, High Performance Phase Change Memory, 1999, http://klabs.org/richcontent/MAPLDCon99/Papers/P21_Tyson_P.PDF#search=$^1$nonvolatile%20high%20density%20high%20performance%20phase%20change%20memory$^1$, 8 pages.
Wicker, Guy, "A Comprehensive Model of Submicron Chalcogenide Switching Devices," Doctoral Dissertation, Wayne State University, Detroit, MI, 1996.
Wolf, Stanley, Excerpt from: Silicon Processing for the VLSI Era-vol. 4, pp. 674-679, 2004.
Yi, J. H. et al., "Novel Cell Structure of PRAM with Thin Metal Layer Inserted GeSbTe," IEEE IEDM 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.
Gibson, G.A. et al., "Phase-change Recording Medium that Enables Ultrahigh-density Electron-beam Data Storage," Applied Physics Letter, 2005, 3 pp., vol. 86.
Happ, T.D. et al., "Novel None-Mask Self-Heating Pillar Phase Change Memory," 2006 Symposium on VLSI Technology, 2 pp.
Hudgens, S. et al., "Overview of Phase-Change Chalcogenide Nonvolatile Memory Technology," MRS Bulletin, Nov. 2004, pp. 829-832.
"Magnetic Bit Boost," www.sciencenews.org <http://www.sciencenews.org>, Dec. 18 & 25, 2004, p. 389, vol. 166.
"New Memories Tap Spin, Gird for Battle," Science News, Apr. 3, 1999, p. 223, vol. 155.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Wuttig, Matthias, "Towards a Universal Memory?" Nature Materials, Apr. 2005, pp. 265-266, vol. 4.

Ahn, S. J. et al., "Highly Reliable 5nm Contact Cell Technology for 256Mb PRAM," VLSI Technology, Digest of Technical Papers, Jun. 14-16, 2005, pp. 98-99.

* cited by examiner

SURFACE TOPOLOGY IMPROVEMENT METHOD FOR PLUG SURFACE AREAS

CROSS-REFERENCE TO OTHER APPLICATIONS

This application claims the benefit of U.S. Patent Application No. 60/741,828 filed 2 Dec. 2005 entitled Surface Topology Improvement Method For Surfaces With Tungsten Areas.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

FEDERALLY SPONSORED RESEARCH OR DEVELOPMENT

None.

BACKGROUND OF THE INVENTION

Tungsten is often deposited in vias, trenches and other holes within a dielectric layer to create plugs other structures within semiconductor devices. The deposition of tungsten is typically by a chemical vapor deposition (CVD) process. As crystalline tungsten fills the hole from all sides, a narrow seam is typically created down the middle of the hole. When using tungsten to fill a hole having a high aspect ratio, such as when filling a via to create a tungsten plug, a portion of the seam often does not close to create a void within the tungsten plug. Therefore, after chemical mechanical polishing (CMP), the exposed areas of the tungsten structures; sometimes referred to below as plug surface areas or plug areas, or tungsten areas or tungsten plug areas, commonly have exposed pits, grooves or other recessed regions created following the CMP procedure. For example, when tungsten is deposited to create a tungsten plug, the tungsten plug may have an internal void but the upper end of the tungsten plug is typically closed. However, after CMP, the upper end of the tungsten plug may be cut back enough to expose the internal void, thus creating the recessed area. The resulting surface topology of such surfaces is thereby degraded which can cause problems, such as poor electrical contact to overlying structures, during later manufacturing steps.

BRIEF SUMMARY OF THE INVENTION

A first aspect of the present invention is directed to a method for improving the surface topology of a surface of a semiconductor device, the surface comprising plug areas, typically tungsten areas. The method comprises: removing material from a semiconductor device to create a first planarized surface with plug areas. At least one plug area comprises a recessed region, the recessed region comprising an upper portion at the planarized surface. A material is deposited onto the first planarized surface to create a material layer; the depositing step further comprising depositing the material into the upper portion of the recessed region. The material layer is removed to create a second planarized surface with the upper portion of the recessed region of the at least one plug area containing the material.

A second aspect of the invention is directed to a method for improving the surface topology of a surface of a semiconductor phase change memory device, the surface comprising tungsten areas. The method comprises: removing material from a semiconductor device by performing a first, tungsten CMP procedure on the semiconductor device to create a first planarized surface with tungsten areas, at least one tungsten area comprising a recessed region, the recessed region comprising an upper portion at the planarized surface; depositing a material onto the first planarized surface to create a material layer; the depositing step further comprising depositing the material into the upper portion of the recessed region; removing the material layer by performing a second CMP procedure to remove the material layer to create a second planarized surface, the upper portion of the recessed region of the at least one tungsten area containing the material; and forming a phase change element between the at least one tungsten area, acting as a first electrode, at the second planarized surface and a second electrode to form a phase change memory device, the phase change memory device usable to create a random access semiconductor memory.

Various features and advantages of the invention will appear from the following description in which the preferred embodiments have been set forth in detail in conjunction with the accompanying drawings.

DETAILED DESCRIPTION OF THE INVENTION

Figure 1:
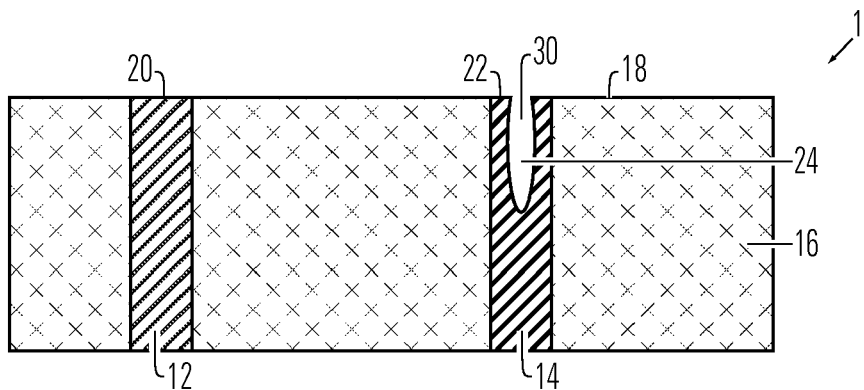
FIG. 1 is a simplified side cross-sectional view of a portion of a semiconductor device following a first, conventional CMP procedure to create a first planarization surface with tungsten plugs being exposed to create exposed tungsten areas at the first planarization surface.

The following description of the invention will typically be with reference to specific structural embodiments and methods. It is to be understood that there is no intention to limit the invention to the specifically disclosed embodiments and methods but that the invention may be practiced using other features, elements, methods and embodiments. Like elements in various embodiments are commonly referred to with like reference numerals.

FIG. 1 is a simplified side cross-sectional view of a portion 10 of a semiconductor device following a first, conventional CMP procedure suitable for polishing tungsten. Portion 10 has tungsten plugs 12, 14, or other tungsten structures, within an inter-layer insulation 16, including, for example, one or more layers of silicon dioxide, silicon oxynitride, silicon nitride, or other material. The first CMP procedure creates a first planarization surface 18 with tungsten plugs 12, 14 being exposed at their upper ends to create exposed tungsten areas 20, 22, also called plug areas or plug surface areas, at the first planarization surface. Tungsten area 22 has an expose a recessed region 24 extending into plug 14 from first planarization surface 18. Recessed region 24 is typically created as a result of the first, conventional CMP procedure.

Figure 2:
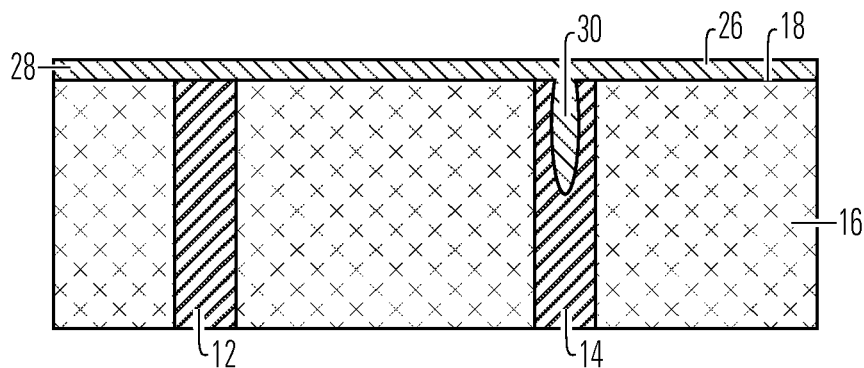
FIG. 2 illustrates the structure of FIG. 1 after a material has been deposited on the first planarization surface to create a material layer over the surface and to fill in at least the upper portion of the recessed region of a tungsten plug.

FIG. 2 illustrates the structure of FIG. 1 after a material 26 has been deposited on first planarization surface 18 to create a material layer 28 over surface 18. Material 26 also fills in at least the upper portion 30 of recessed region 24 of tungsten plug 14. Material 26 is typically TiN deposited through chemical vapor deposition (CVD). Other processes, such as atomic layer deposition (ALD) and plasma vapor deposition (PVD), may also be used. Other materials, such as TaN, Si, and $SiO_2$, may also be used. Although it is preferred that material 26 be a metal, in some situations a material other than a metal may be appropriate.

Figure 3:
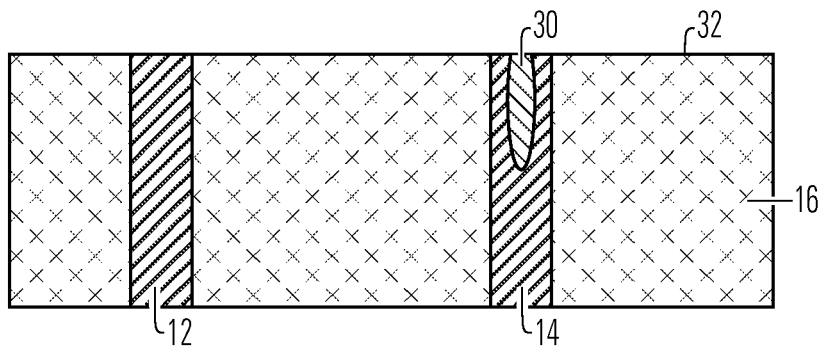
FIG. 3 shows the structure of FIG. 2 after a second CMP procedure to create a second planarized surface in which the material layer has been removed with the material retained within the upper portion of the recessed region to improve the surface topology of the second planarized surface.

TiN is especially preferred for material 26 when, as discussed below with reference to FIG. 7, the structure of FIG. 3 is used in making phase change memory devices. Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access. TiN can provide good electrical contact with $Ge_2Sb_2Te_5$, commonly referred to as GST, as well as other phase change materials, thus making it especially suitable for material 26 in such phase change memory devices.

FIG. 3 shows the structure of FIG. 2 after a second CMP procedure to create a second planarized surface 32 in which material layer 28 has been removed. The second CMP procedure is typically gentler than the first CMP procedure. Typically a small amount of material along first planarization surface 18 is also removed during the second CMP procedure. Material 26 is retained within upper portion 30 of recessed region 24 to improve the surface topology of second planarized surface 32 effectively eliminating the recessed region.

Figure 4:
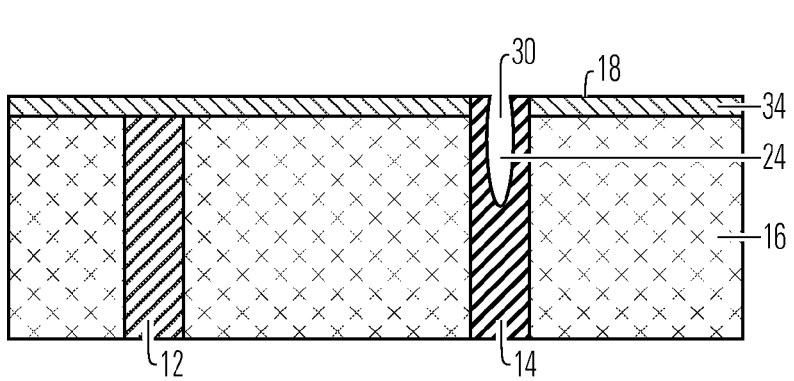
FIG. 4 illustrates a view of an alternative embodiment of the invention similar to that of FIG. 1 in which the portion of the semiconductor device has a tungsten CMP stop layer at the first planarized surface.

FIG. 4 illustrates a view of an alternative embodiment of the invention similar to that of FIG. 1 showing a portion 10 of a semiconductor device after a first, conventional CMP process. The first CMP process smooths over the upper ends of exposed at tungsten structures, such as tungsten plug 14, and exposes a tungsten CMP stop layer 34 defining first planarized surface 18. Stop layer 34 can be TiN, SiN or other materials which can act as an edge stop layer.

Figure 5:
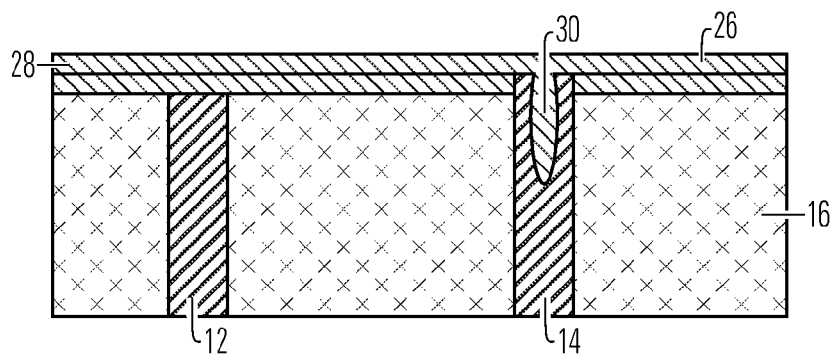
FIG. 5 is a view, similar to that of FIG. 2, illustrating the result of depositing a material over the first planarized surface and within the recessed region of a tungsten plug of the structure of FIG. 4.
Figure 6:
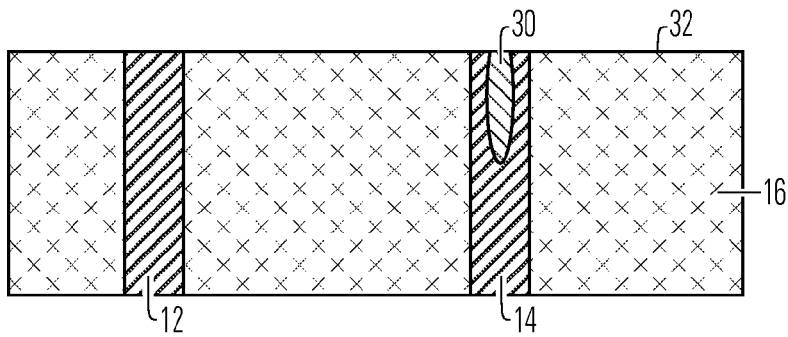
FIG. 6 shows the structure of FIG. 5 after a second CMP procedure which removed the material and the stop layer to create a structure similar to that of FIG. 3.

FIG. 5 is a view similar to that of FIG. 2 illustrating the result of depositing material 26 over first planarized surface 18 and within recessed region 24 of tungsten plug 14. FIG. 6 shows the structure of FIG. 5 after a second CMP procedure which removed material layer 28 and stop layer 34 to create a structure similar to that of FIG. 3. Second planarized surface 32 has an improved topology over first planarized surface 18 because of the presence of material 26 within recessed region 24. One of the advantages of the embodiment of FIGS. 4-6 with stop layer 34, is that less of inter-layer insulation 16 can be lost during the process when compared with the process steps of the embodiment of FIGS. 1-3.

Figure 7:
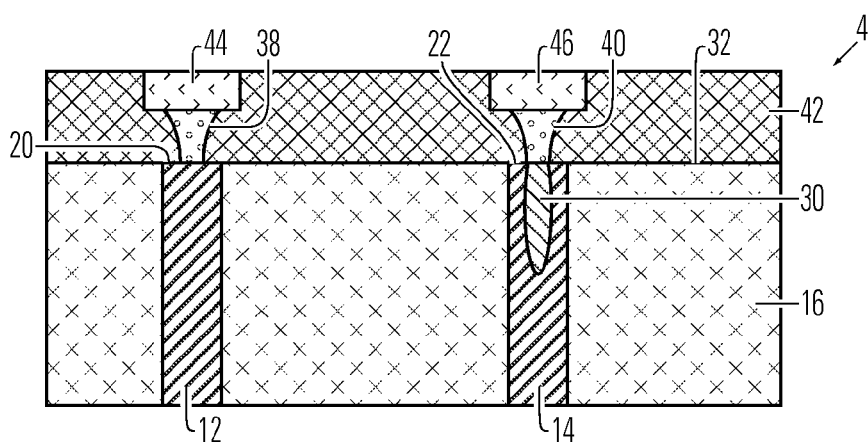
FIG. 7 shows the structure of FIG. 3 after depositing phase change material to create a phase change memory device.
Figure 8:
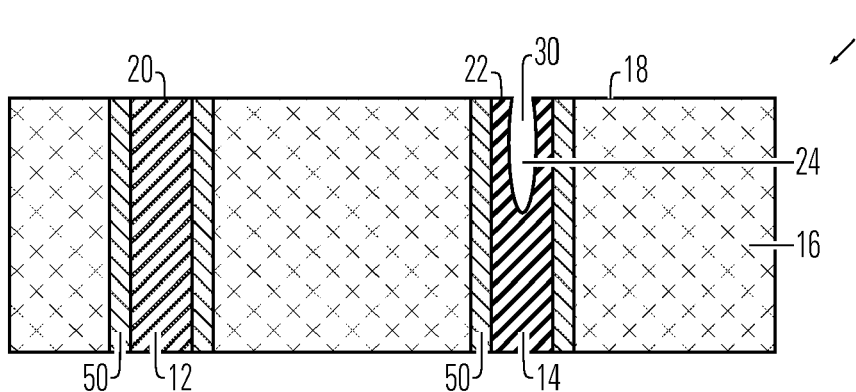
FIGS. 8-14 are views of alternative embodiments corresponding to the embodiments of the FIGS. 1-7.
Figure 9:
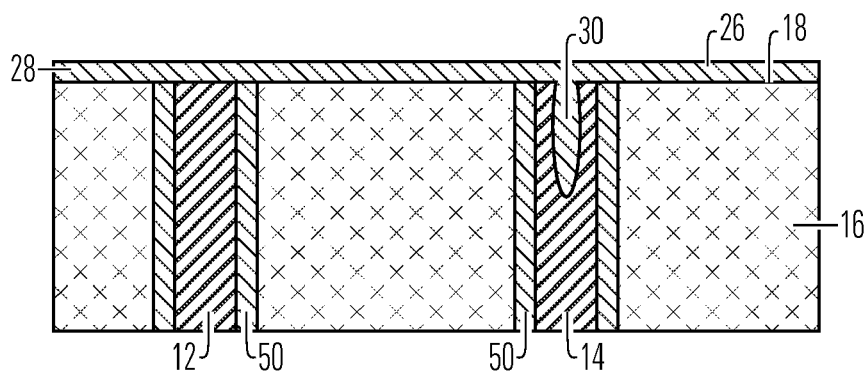
Figure 10:
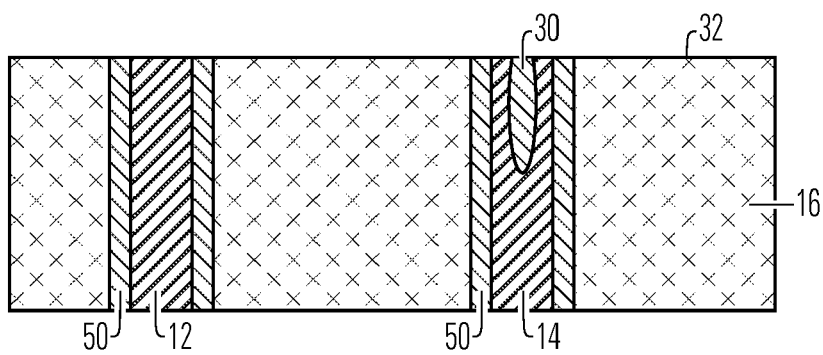
Figure 11:
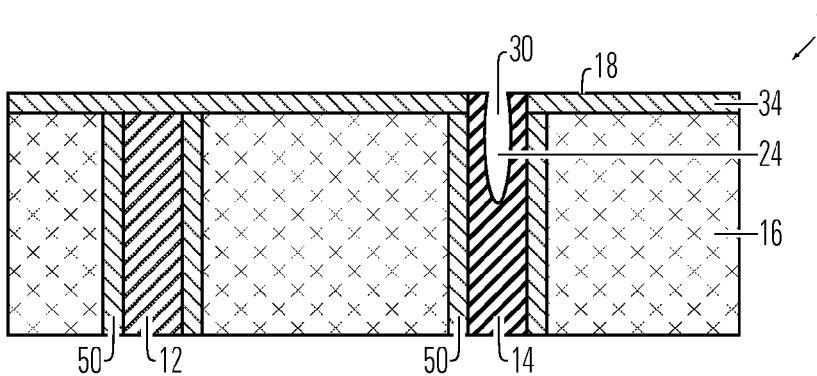
Figure 12:
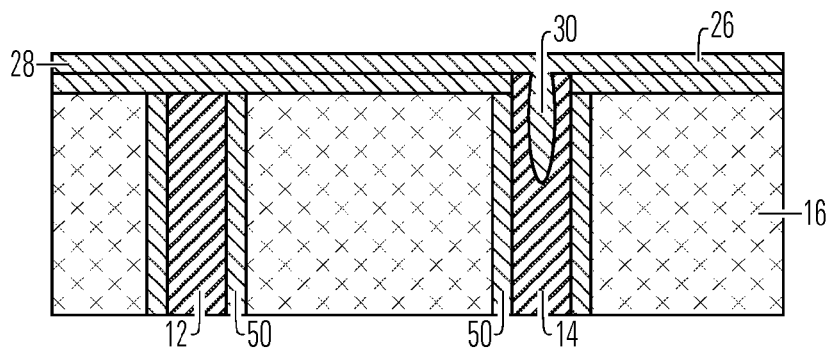
Figure 13:
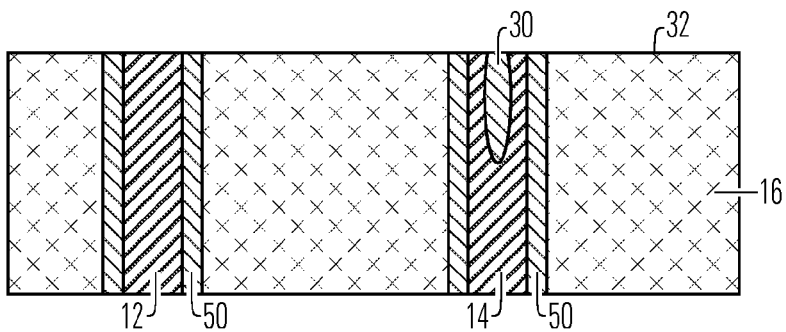
Figure 14:
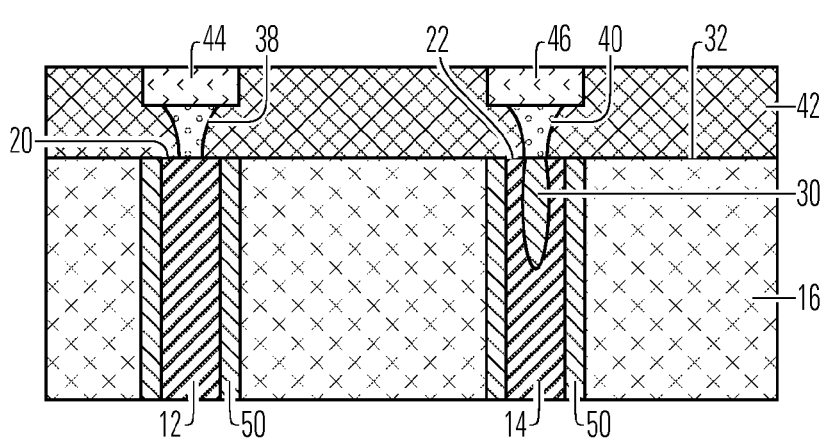

FIG. 7 illustrates the structure of FIG. 3 upon which phase change material has been deposited to create, after additional semiconductor processing steps, phase change elements 38, 40. Phase change elements 38, 40 are in contact with tungsten areas 20, 22 and are surrounded by a spacer material 42. Phase change elements 38, 40 are captured between tungsten areas 20, 22, which serve as first electrodes, and second electrodes 44, 46. Material 26 within upper portion 30 may be chosen to ensure good adhesion to and contact with the phase change material of phase change elements 38, 40. As mentioned above, TiN adheres very well to GST, as well as other phase change materials, thus making it especially suitable for material 26. The resulting phase change memory device 48 is particularly suited for use in making semiconductor random access memories.

FIGS. 8-14 are views of alternative embodiments corresponding to the embodiments of the FIGS. 1-7. The main difference is the use of a barrier layer of 50 on the side wall of plugs 12, 14. Barrier layer of 50 is electrically conductive and is made from one or more materials or layers of materials, such as TiN or TaN.

The above descriptions may have used terms such as above, below, top, bottom, over, under, et cetera. These terms are used to aid understanding of the invention are not used in a limiting sense.

The above description has been described in terms of using tungsten. However, the invention can be used with other electrically conductive materials instead of tungsten. For example, the invention can be used when copper is used in, for example, the dual Damascene process to create copper plug interlevel connections and therefore copper-type plug areas.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

What is claimed is:

1. A method for improving the surface topology of a surface of a semiconductor device, including at least one plug having a void formed therein, comprising:
   exposing the void by removing material from the semiconductor device to create a first planarized surface and to create a recessed region within the plug, the recessed region comprising an upper portion at the first planarized surface;
   depositing a material onto the first planarized surface to create a material layer, wherein the depositing step further comprises depositing the material into the upper portion of the recessed region; and
   removing the material layer to create a second planarized surface so that the material deposited into the recessed region has an upper surface at the second planarized surface.

2. The method according to claim 1 wherein the first removing step is carried out with the first planarized surface defined by a tungsten CMP stop layer and a tungsten area defined by the plug.

3. The method according to claim 2 wherein the second removing step removes both the material layer and the tungsten CMP stop layer.

4. The method according to claim 1 wherein the material depositing step is carried out by CYD TiN deposition.

5. The method according to claim 1 wherein the first removing step comprises performing a first, tungsten CMP procedure on the semiconductor device and the plug comprises a tungsten plug.

6. The method according to claim 1 wherein the second removing step comprises performing a second CMP procedure to remove the material layer.

7. The method according to claim 1 further comprising forming a phase change element between the plug, acting as a first electrode, at the second planarized surface and a second electrode to form a phase change memory device.

8. The method according to claim 1 wherein the first removing step is carried out with the plug comprising a tungsten plug.

9. The method according to claim 1 wherein the first removing step is carried out with the plug comprising a copper plug.

10. The method according to claim 1 wherein the first removing step is carried out with the semiconductor device comprising the plug within an insulation layer.

11. The method according to claim 10 wherein the first removing step is carried out with the semiconductor device comprising a barrier layer between the plug and the insulation layer.

12. The method according to claim 11 wherein the first removing step is carried out with the barrier layer comprising an electrically conductive material.

13. A method for improving the surface topology of a surface of a semiconductor phase change memory device, including at least one plug having a void formed therein, comprising:
    exposing the void by removing material from the semiconductor device by performing a first CMP procedure on the semiconductor device to create a first planarized surface and a recessed region within a tungsten plug, the recessed region comprising an upper portion at the planarized surface;
    depositing a material onto the first planarized surface to create a material layer, wherein the depositing step further comprises depositing the material into the recessed region;
    removing the material layer by performing a second CMP procedure to create a second planarized surface, the recessed region having an upper surface at the second planarized surface; and
    forming a phase change element between the tungsten plug, acting as a first electrode, at the second planarized surface and a second electrode to form a phase change memory device.

14. The method according to claim 13 wherein the first removing step is carried out with the semiconductor device comprising a tungsten plug within an insulation layer and a barrier layer between the tungsten plug and the insulation layer.

* * * * *